(12) United States Patent
Tsujimura et al.

(10) Patent No.: US 6,801,266 B1
(45) Date of Patent: Oct. 5, 2004

(54) THIN FILM TRANSISTOR, LIQUID CRYSTAL DISPLAY PANEL, AND METHOD OF MANUFACTURING THIN FILM TRANSISTOR

(75) Inventors: Takatoshi Tsujimura, Fujisawa (JP); Takashi Miyamoto, Chofu (JP); Osamu Tokuhiro, Shiqa-ken (JP); Mitsuo Morooka, Kawasaki (JP)

(73) Assignee: International Business Machines Corporation, Armonk, NY (US)

( * ) Notice: Subject to any disclaimer, the term of this patent is extended or adjusted under 35 U.S.C. 154(b) by 230 days.

(21) Appl. No.: 09/614,767

(22) Filed: Jul. 12, 2000

(30) Foreign Application Priority Data

Jul. 29, 1999 (JP) .......................................... 11-214603

(51) Int. Cl.[7] .............................................. G02F 1/136
(52) U.S. Cl. .......................................... 349/42; 438/30
(58) Field of Search ...................... 349/42, 142; 438/30

(56) References Cited

U.S. PATENT DOCUMENTS 5,097,297 A * 3/1992 Nakazawa ................... 257/347
5,305,128 A * 4/1994 Stupp et al. ................. 349/140
5,986,723 A * 11/1999 Nakamura et al. ............ 349/39

FOREIGN PATENT DOCUMENTS

JP 2516030 3/1989

* cited by examiner

Primary Examiner—Tarifur R. Chowdhury
Assistant Examiner—P. R. Akkapeddi
(74) Attorney, Agent, or Firm—Scully, Scott, Murphy & Presser; Robert M. Trepp, Esq.

(57) ABSTRACT

The present invention reduces the number of necessary steps in a thin-film-transistor manufacturing process and prevents an abnormal potential from being generated due to a leakage current from another signal line. A thin film transistor comprises a gate electrode 30 disposed on a predetermined substrate and formed in a predetermined pattern, a semiconductor layer 27 formed correspondingly to patterning of the gate electrode 30, a pixel electrode 25 interposed by the semiconductor layer, and a signal electrode 26 interposed by the semiconductor layer and disposed at a predetermined interval from the pixel electrode 25, in which the signal electrode 26 is disposed at such a position where the signal electrode prevents crosstalk leakage current flowing from adjacent signal lines 32b and 32c to the pixel electrode 25 via the semiconductor layer.

7 Claims, 8 Drawing Sheets

THIN FILM TRANSISTOR, LIQUID CRYSTAL DISPLAY PANEL, AND METHOD OF MANUFACTURING THIN FILM TRANSISTOR

BACKGROUND OF THE INVENTION

1. Technical Field

The present invention relates to a thin film transistor used for an active-matrix-type liquid-crystal display and a method for fabricating the thin film transistor, and a liquid-crystal display panel using the thin film transistor.

2. Prior Art

An active-matrix-type liquid-crystal display unit using a thin film transistor realizes displaying by arranging gate electrodes (Y-electrodes) and data electrodes (X-electrodes) like a matrix, injecting liquid crystal between a TFT array substrate configured by arranging thin film transistors (TFTS) at intersections of the matrix and a substrate facing and superimposed above the TFT array substrate, controlling a voltage to be applied to the liquid crystal by the thin film transistors, and using the electro-optical effect of the liquid crystal.

Figure 7:
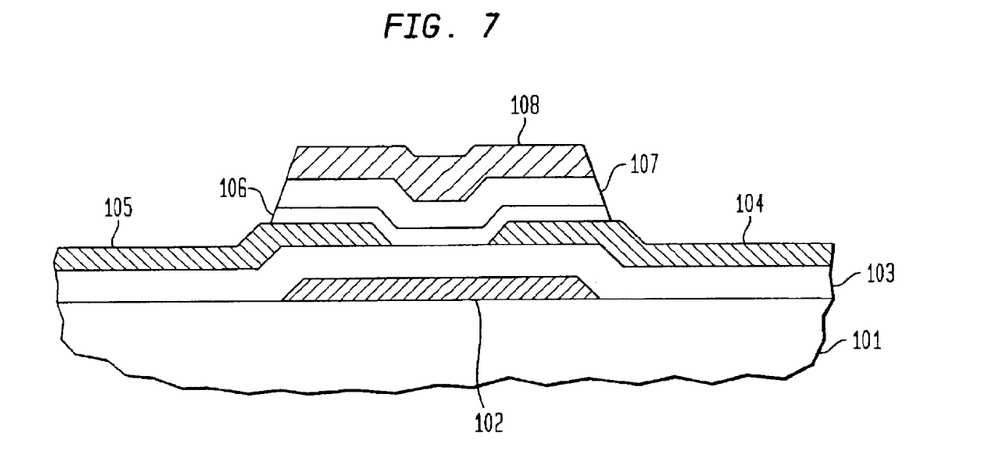
FIG. 7 is an illustration showing a typical structure of a conventional thin film transistor.

In this case, a normal-stagger-type (top-gate-type) structure and a reverse-stagger-type (bottom-gate-type) structure are known as structures of a thin film transistor. FIG. 7 shows a typical structure of a normal-stagger-type (top-gate-type) thin film transistor. As shown in FIG. 7, the top-gate-type thin film transistor is configured by forming an opaque film 102 on an insulating substrate 101 such as a glass substrate and providing an insulating film 103 made of silicon oxide SiOx, silicon nitride SiNx or the like on the opaque film 102. Moreover, a drain electrode 104 and a source electrode 105 which are respectively configured of an ITO (indium-tin oxide) film are provided on the insulting film 103 by keeping a channel interval, an amorphous-silicon film (a-Si-film) 106 for covering the electrodes 104 and 105 is provided, a gate insulating film 107 made of SiOx, SiNx or the like is provided on the film 106, and a gate electrode 108 is provided on the film 107, and thereby an island-shaped region referred to as a-Si island is formed.

As a process for fabricating the thin film transistor, there is the so-called 7PEP (PEP: Photo Engraving Process) structure. In case of the 7PEP structure, the drain electrode 104 and source electrode 105 respectively made of an ITO film are patterned and then, the a-Si film 106 is formed through the CVD (Chemical Vapor Deposition) art and patterned like an island. Thereafter, the gate insulating film 107 is formed through the CVD art and patterned into a predetermined shape. Thereafter, a TFT is completed by forming, for example, an aluminum (Al) film as the gate electrode 108 through sputtering and by patterning the film.

However, because the number of steps increases in case of the 7PEP structure, a next-generation 4PEP structure requiring a less number of steps is proposed. The 4PEP structure is configured by etching the gate insulating film 107 and a-Si film 106 below the gate electrode 108 at the same time. That is, the gate electrode 108, gate insulating film 107, and a-Si film 106 are continuously etched through one-time patterning process by using a gate-electrode plating pattern as a mask. Therefore, the 4PEP structure is very superior in reduction of the number of manufacturing steps.

Though not concerned with reduction of the number of manufacturing steps, there is the official gazette of Japanesse Published Unexamined Patent Application No. 1-68968 as a background art relating to an electrode structure of the present invention. This official gazette discloses a thin film transistor art of arranging a source electrode and a drain electrode in parallel with each other and moreover making these electrodes orthogonal to a gate electrode.

Moreover, a display data signal and a scanning signal are supplied to a drain line and a gate line connected with a thin film transistor from an external unit. In general, a gate line is connected to a gate electrode on an insulating film made of SiOx or SiNx provided on an insulating substrate. Therefore, portions corresponding to the gate insulating film 107 and a-Si film 106 below the gate electrode 108 in a thin film transistor structure are generally removed in case of a gate-line structure excluding an a-Si island.

However, when using the above 4PEP structure in order to reduce the number of steps, a structure similar to an a-Si island is also formed on a gate line because etching and forming a three-layer film through a patterning process once. That is, the a-Si film 106, and gate insulating film 107 unnecessary for the structure cannot be removed from a gate line exceeding an a-Si island and thereby, the films 106 and 107 are directly formed.

Figure 8:
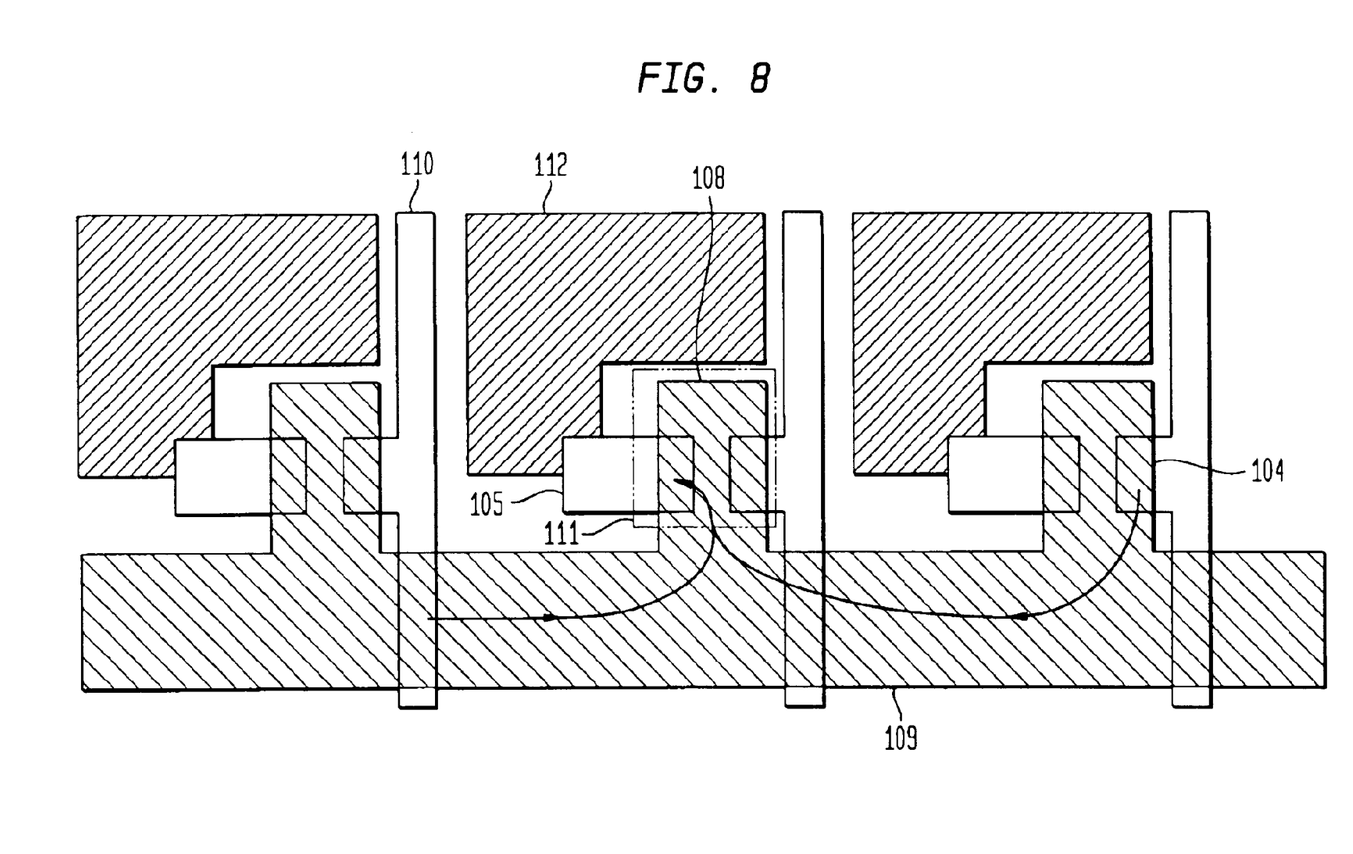
FIG. 8 is a top view for explaining a thin-film-transistor structure not constituting the present invention.

FIG. 8 is a top view of a thin film transistor under the above state. A TFT necessary as a liquid-crystal display panel is an a-Si island 111 formed on a gate electrode 108 serving as a protruded portion of a gate line 109. However, another TFT is present on the gate line 109 other than the a-Si island 111 due to the above 4PEP structure. Therefore, a leak current shown by arrows in FIG. 8 are generated from adjacent other data lines 110, adjacent other drain electrodes 104 or the like, and flows into a source electrode 105 and thereby, an extra current flows through a display electrode 112. As a result, no sufficient potential is written in a pixel due to an extra current (crosstalk) and this insufficient write causes extreme deterioration of a display image.

The present invention is made to solve the above technical problems and its object is to reduce the number of necessary steps in a thin-film-transistor manufacturing process and prevent an abnormal potential from occurring due to a leak current from other data lines.

It is another object of the present invention to provide a thin film transistor capable of preventing flickering or sticking due to the change of capacities Cgs between a gate and a source even if a pattern is shifted between a gate line and a signal line.

SUMMARY OF THE INVENTION

To solve the above problems, a thin film transistor of the present invention is mounted on a predetermined substrate and provided with a gate electrode formed into a predetermined pattern, a semiconductor layer formed correspondingly to the patterning of the gate electrode, a pixel electrode interposed by the semiconductor layer, and a signal electrode interposed by the semiconductor layer by keeping a predetermined interval from the pixel electrode. The signal electrode is formed at a position for preventing crosstalk running from an adjacent signal electrode to the pixel electrode through the semiconductor layer.

In this case, it is also possible to pattern-form a gate insulating film together with the semiconductor layer correspondingly to the patterning of the gate electrode. Specifically, it is preferable to constitute the semiconductor layer and the gate insulating film so that they are formed in accordance with almost the same pattern as the case of the patterning of the gate electrode.

Moreover, a structure of a thin film transistor of the present invention is allowed to use not only the normal-stagger type (top-gate-type) but also the reverse-stagger type (bottom-gate type). In case of the reverse-stagger type (bottom-gate type), a gate electrode can be provided on a substrate and a semiconductor layer can be formed above the gate electrode through a gate insulating film as well as pattern-formed correspondingly to the patterning of the gate electrode. On the other hand, in case of the normal-stagger type (top-gate type), a semiconductor layer can be formed on a layer lower than a gate insulating film formed on the lower layer of a gate electrode. Application to the normal-stagger type (top-gate type) is particularly superior because the number of photomask steps can be easily reduced.

Moreover, by disposing a signal electrode at a position for preventing crosstalk running from an adjacent signal electrode to a pixel electrode through a semiconductor layer, it is possible to prevent a leak current from other signal line which should not flow into the pixel electrode. More specifically, it is preferable to dispose a signal electrode so as to isolate a gate electrode formed on an a-Si island from a gate line.

Furthermore, a thin film transistor of the present invention has a source electrode provided on a predetermined substrate, a drain electrode disposed by keeping a predetermined interval from the source electrode, a semiconductor layer disposed so as to contact the source electrode and drain electrode and connect the both electrodes, a gate insulating film for covering the semiconductor layer, and a gate electrode disposed so as to contact the gate insulating film. The gate electrode is provided with a protruded portion almost orthogonal to the source and drain electrodes so as to be patterned, the semiconductor layer and gate insulating film are pattern-formed in accordance with the patterning of the gate electrode, and the drain electrode is disposed at a position nearby the root of the protruded portion of the gate electrode for the source electrode.

In this case, when the semiconductor layer and gate insulating film are formed in the patterning step same as the case of the gate electrode, it is possible to prevent an extra current from running from an adjacent signal line (data line) into the source electrode through a gate line. Therefore, this is superior in that a display image can be prevented from deteriorating.

Moreover, the source electrode and the drain electrode are preferable in that it is possible to prevent inflow of crosstalk and it is possible to provide a thin film transistor free from fluctuation of stray capacitance even if a pattern shift occurs between a gate line and a signal line because the electrodes are arranged at a predetermined line width and in parallel with each other.

Furthermore, a liquid-crystal display panel of the present invention is a liquid-crystal display channel having a pixel electrode and a thin-film-transistor-channel structure for applying a voltage to the pixel electrode and provided with a gate line for forming a gate electrode in the thin-film-transistor-channel structure, a signal line to be connected to a signal electrode in the thin-film-transistor-channel structure, and a semiconductor layer to be patterned under a state along the gate line exceeding the thin-film-transistor-channel structure, in which the signal electrode is configured so as to prevent a current incoming from an adjacent signal line for applying a voltage to the pixel electrode and a pixel electrode adjacent to the former pixel electrode through the semiconductor layer.

In this case, because the semiconductor layer remains on the gate line and has a parasitic thin film transistor between the adjacent signal line and the thin-film-transistor-channel structure, a large operation/working effect is obtained in that crosstalk from an adjacent pixel electrode can be effectively prevented when etching a semiconductor layer by using gate-line resist or a gate-line plating pattern as a mask in a panel structure directly using a gate electrode as a gate wiring.

Moreover, a liquid-crystal display panel of the present invention is applied to not only a top-gate-type thin-film-transistor structure but also a bottom-gate-type thin-film-transistor structure. In case of the bottom-gate type, this gate electrode is formed on a substrate and the semiconductor layer is formed on a layer upper than a gate insulating film formed on the upper layer of the gate electrode. In case of the top-gate type, the semiconductor layer of it is formed on a layer lower than a gate insulating film formed on the lower layer of a gate electrode.

Furthermore, a thin-film-transistor manufacturing method of the present invention comprises the opaque film step of forming an opaque film having a predetermined shape on a substrate; the insulating film step of forming an insulating film on the substrate so as to cover the opaque film; the source-and drain-electrode forming step of forming a source electrode and a drain electrode made of metallic films having a predetermined line width and length and separated from each other by a predetermined interval; the semiconductor-and-insulating-film-layer forming step of forming a semiconductor layer and a gate insulating film layer in order on the insulating film above the source and drain electrodes, the gate-electrode forming step of forming a metallic film for a gate electrode on the gate insulating film layer; and the pattern forming step of patterning the semiconductor layer, gate insulating film layer, and metallic film for a gate electrode and thereby, forming a protruded TFT portion having a thin-film-transistor-channel structure and forming a semiconductor layer and a gate insulating film layer at a position of a gate electrode exceeding the protruded TFT portion; in which the source-and-drain-electrode forming step forms at least either of a source electrode and a drain electrode serving as a signal electrode so as to cross the protruded TFT portion formed in the pattern forming step.

Furthermore, in the thin-film-transistor manufacturing method, the pattern forming step pattern-forms a semiconductor layer, a gate insulating layer, and a metallic film for a gate electrode in the same patterning step. In other words, a pattern forming step of the present invention pattern-forms a semiconductor layer, a gate insulating film layer, and a metallic film for a gate electrode in almost the same shape. This feature is superior in that the number of necessary steps can be reduced in a thin-film-transistor manufacturing process capable of preventing an abnormal potential from being generated due to a leak current from other data lines.

BRIEF DESCRIPTION OF THE DRAWINGS

Preferred embodiments of the present invention will now be described, by way of example only, with reference to the accompanying drawings in which.

DETAILED DESCRIPTION OF THE PREFERRED EMBODIMENTS OF THE INVENTION

The present invention is described below in accordance with the embodiment shown in the accompanying drawings.

Figure 1:
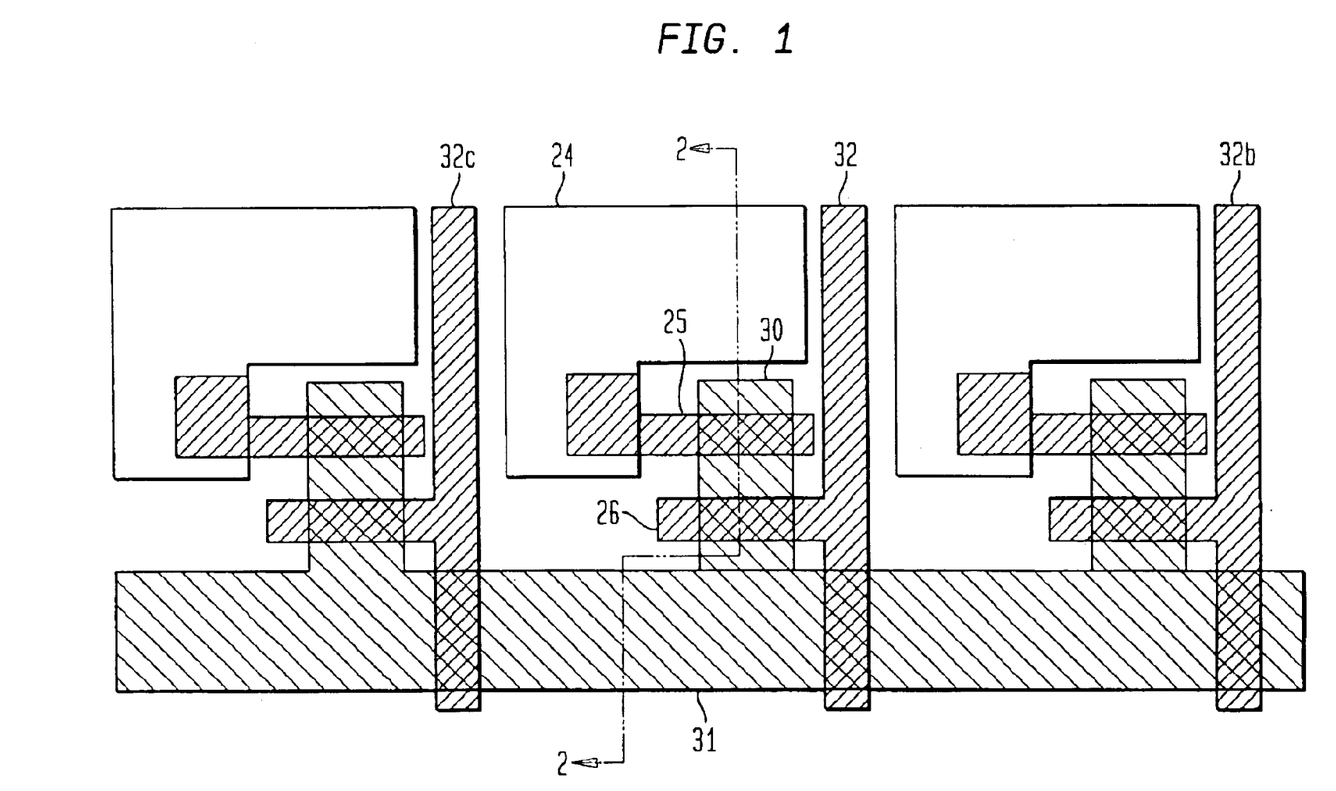
FIG. 1 is a top view showing the thin-film-transistor structure of this embodiment.
Figure 2:
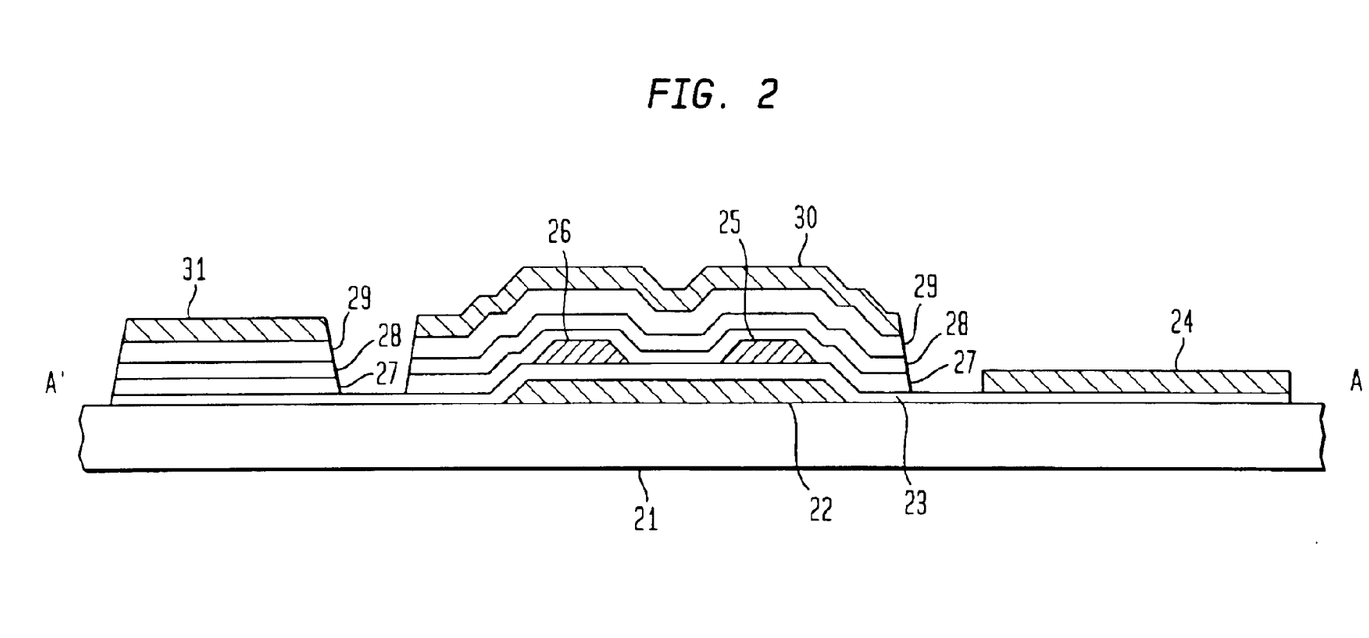
FIG. 2 is a sectional view along directional arrows 2—2 in FIG. 1.

FIG. 1 is a top view showing the thin film transistor structure of this embodiment and FIG. 2 is a sectional view along directional arrows 2—2 in FIG. 1. As shown in FIG. 2, the thin film transistor of this embodiment has an opaque film (light shield) 22 made of a Mo alloy such as Mo and MoCr on an insulting substrate 21 made of non-alkali glass, quartz or the like, and an insulting film 23 serving as an under-coat layer made of silicon oxide SiOx, silicon nitride SiNx or the like so as to cover the upper portion of the opaque film 22. Moreover, a pixel electrode (display electrode) 24 made of indium-tin oxide (ITO) serving as a transparent conductive film is formed on the insulating film 23 and a source electrode 25 and a drain electrode 26 which are formed integrally with the pixel electrode 24 and configured by superimposing a metallic film made of a molybdenum-tungsten (Mo-W) alloy using Mo, Ti, Ta, Cr, Nb, W, Ag or the like on the upper layer of an ITO film are pattern-formed on the insulating film 23.

Furthermore, an a-Si film 27 for forming a semiconductor layer is formed on the upper layers of the pattern-formed source electrode 25 and drain electrode 26 and a first silicon-nitride film (first SiNx film) 28 serving as a gate insulating film and a silicon-nitride film (second SiNx film) 29 which is a gate insulating film serving as a TFT-channel passivation film are formed on the upper layer of the film 27. Furthermore, a gate electrode 30 made of a metal such as Cr or Al is formed on the upper layers of these gate insulating films.

Furthermore, as shown in FIG. 1, the source electrode 25 and the drain electrode 26 are arranged at a predetermined line width so that the electrodes 25 and 26 are separated from each other by a predetermined interval almost parallel with each other. The drain electrode 26 is pattern-formed integrally with a signal line (data line) 32 and the source electrode 25 is formed so as to contact the pixel electrode 24. Furthermore, the gate electrode 30 is configured of a portion protruded from the gate line 31 and directly used as a gate wiring. In case of this embodiment, the so-called a-Si island of a thin film transistor (TFT) is formed by arranging the source electrode 25 and drain electrode 26 so as to be almost orthogonal to the gate electrode 30 serving as a portion protruded from the gate line 31. As shown in FIG. 1, the drain electrode 26 is orthogonal to the gate electrode 30 at a position closer to the gate line 31 than the source electrode 25 and is configured so as to be able to separate the gate electrode 30 for forming an a-Si island from the gate line 31. Moreover, symbols 32b and 32c denote adjacent data lines.

In this case, the thin film transistor of this embodiment simultaneously etches the a-Si film 27, first SiNx film 28 and second SiNx film 29 respectively serving as a gate insulating film by using the pattern of the gate electrode 30 as a mask. As a result, as shown in FIG. 2, the a-Si film 27, first SiNx film 28 and second SiNx film 29 are left at all lower portions of the gate line 31 and an unnecessary semiconductor layer is left below the gate line 31 other than an a-Si island.

Figure 3:
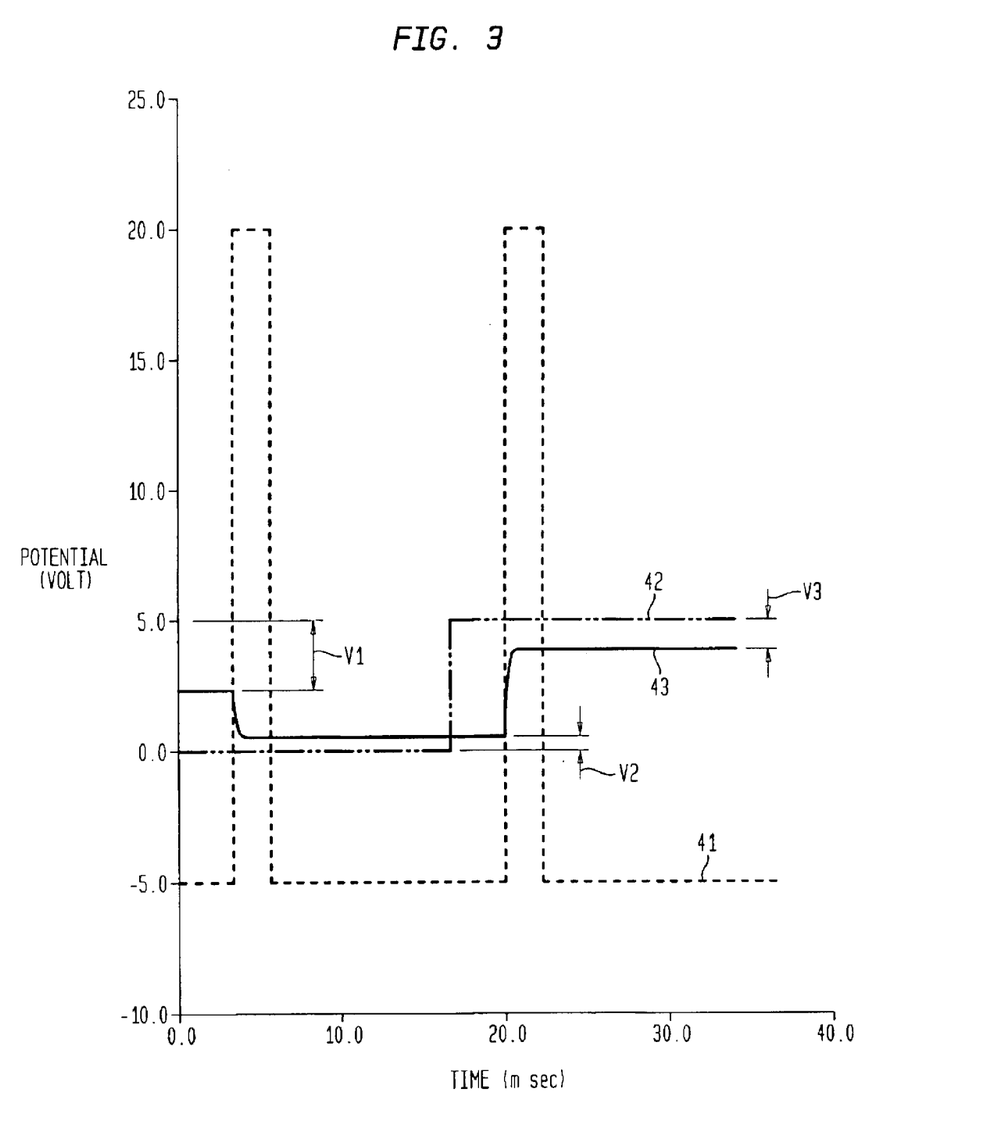
FIG. 3 is a graph showing a driving waveform of a conventional TFT structure.
Figure 4:
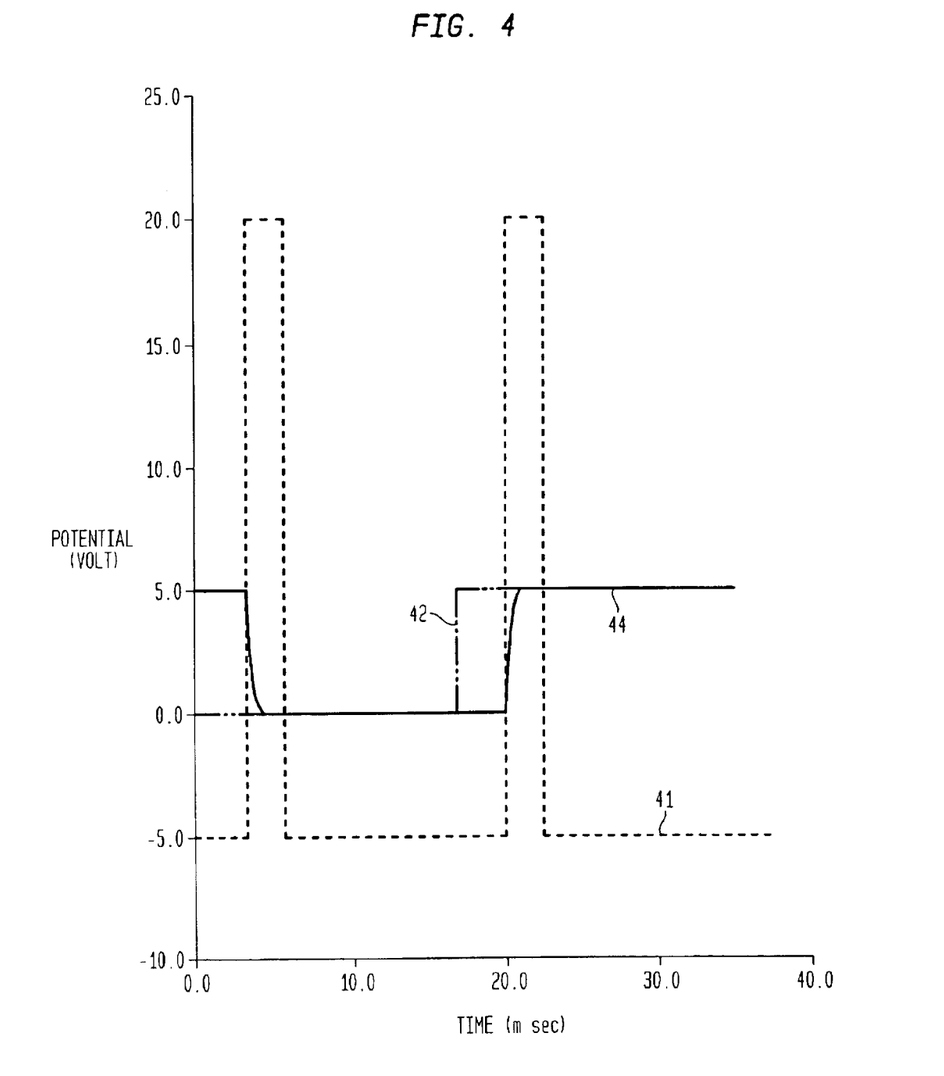
FIG. 4 is a graph showing a driving waveform of the TFT structure of this embodiment.

FIG. 3 shows a driving waveform under a conventional state (for example, the above-described state in FIG. 8) in which a drain electrode is not present at a position for separating the gate electrode 30 for forming an a-Si island from the gate line 31 under a state in which a semiconductor layer is left below the gate line 31. FIG. 4 shows a state in which the drain electrode 26 is present at a position for separating the gate electrode 30 for forming an a-Si island from the gate line 31 under a state in which a semiconductor layer is left below the gate line 31.

In FIGS. 3 and 4, y-axis denotes potential (Volt), x-axis denotes time (msec), a broken line denotes gate-line driving waveform 41, a two-dot chain line denotes data-line waveform 42, and symbols 43 and 44 respectively denote a pixel waveform. Moreover, in FIGS. 3 and 4, gate-on time is exaggeratedly lengthened so as to be easily understood.

In this case, because an electric charge is written in a pixel whenever a gate is turned on, it is preferable that the potential of a pixel follows the potential of the data line shown by the data-line waveform 42. In FIG. 3, however, it can be understood that the pixel waveform 43 is weakened by a value of potential V1, V2, or V3. This is because a semiconductor layer remains on the whole lower portion of the gate line 31 and thereby, a leak current is generated from an adjacent data line while a gate is turned on. That is, because a semiconductor layer is present between an adjacent data line and TFT and a parasitic TFT is present, a current unnecessary or undesired to drive a TFT liquid-crystal display unit is generated due to switching of a gate electrode, and thereby the pixel waveform is weakened.

Moreover, when the source electrode 25 and drain electrode 26 are arranged as shown in FIG. 1, an extra current (crosstalk) from adjacent data lines 32b and 32c does not reach the source electrode 25 due to the presence of the drain electrode 26 though the current tends to flow into protrusions of the data lines. As a result, as shown in FIG. 4, it is possible to keep a state in which normal electric charges are written as the pixel waveform 44. That is, even under the normal state in which a potential difference occurs between the data line 32 and the adjacent data line 32b or 32c because phases are reversed, it is possible to write a sufficient potential in a pixel without being influenced by the crosstalk written from other data line and prevent extreme deterioration of a display image due to insufficient write.

Though the above description is made by taking a normal-stagger-type (top-gate-type) thin film transistor structure as an example, the present invention can be also applied to the reverse-stagger-type (bottom-gate type) and the same operation/working effect can be obtained.

Figure 5A:
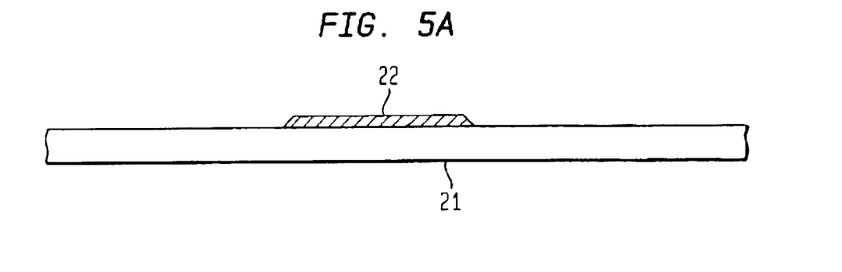
FIGS. 5(a) to 5(d) are illustrations showing TFT manufacturing steps of this embodiment.

Then, a manufacturing process for fabricating the thin film transistor (TFT) of this embodiment is described below by taking a top-gate-type TFT as an example and referring to FIGS. 5(a) to 5(d). As shown in FIG. 5(a), an opaque film (light shield) 22 is formed by first cleaning an insulating substrate 21 such as a glass substrate by means of mechanical cleaning such as brushing (scrubbing) or chemical cleaning using an acid or organic solvent and then forming a Mo alloy for shielding light at a predetermined film thickness by means of magnetron sputtering, and using photolithography for performing photo-etching by using photoresist as a mask.

Figure 5B:
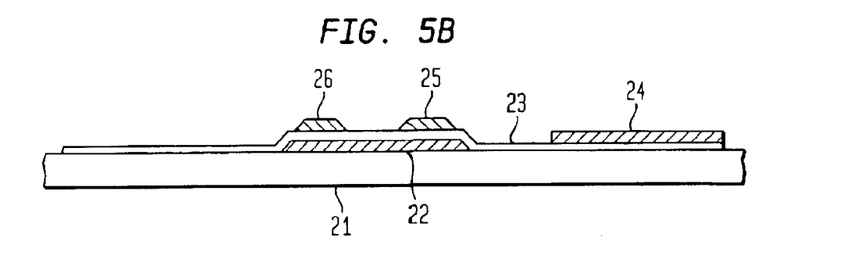

Then, as shown in FIG. 5(b), an insulating film 23 made of a silicon-oxide film (SiOx) having a large adhesion is formed as a layer insulating film in accordance with the plasma CVD method. Then, films of drain- and source-electrode ITO and data-bus-line Mo alloy are continuously formed through magnetron sputtering and the data bus line and the drain and source electrodes are patterned through photolithography after forming the films to form the source electrode 25 and drain electrode 26. Moreover, a pixel-electrode ITO is formed similarly to the case of a gate electrode to form the pixel electrode 24 through patterning. In case of this embodiment, the source electrode 25 and drain electrode 26 are considered so that the electrodes are parallel with each other at a predetermined line width and a predetermined interval and almost orthogonal to the gate electrode 30 configured of a portion protruded from the gate line 31 and moreover, the electrodes 25 and 26 are patterned so that the drain electrode 26 can be set nearby the root of the protruded portion.

Figure 5C:
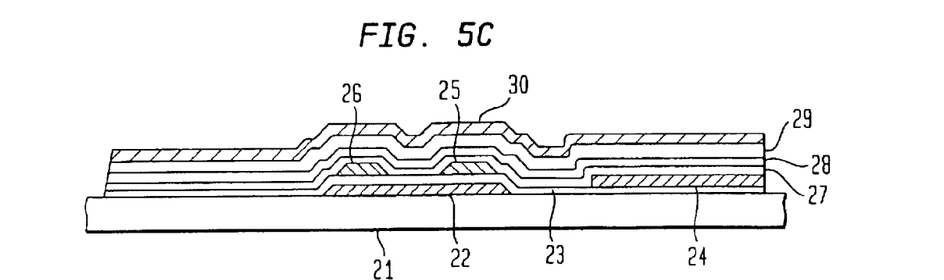

Then, as shown in FIG. 5(c), the a-Si film 27 serving as a semiconductor material is formed through plasma CVD and thereafter, the first SiNx film 28 and second SiNx film 29 respectively serving as a gate insulating film are formed in order. Moreover, an Al film for the gate electrode 30 and an Al film for the gate line 31 are formed through magnetron sputtering by omitting etching of the films 28 and 29. In case of this embodiment, the independent etching step after forming the a-Si film 27, first SiNx film 28, and second SiNx film 29 is omitted. As a result, when an Al film is formed, the a-Si film 27, first SiNx film 28, and second SiNx film 29 are arranged on the entire surface of the lower layer of the Al film exceeding the above a-Si island.

Figure 5D:
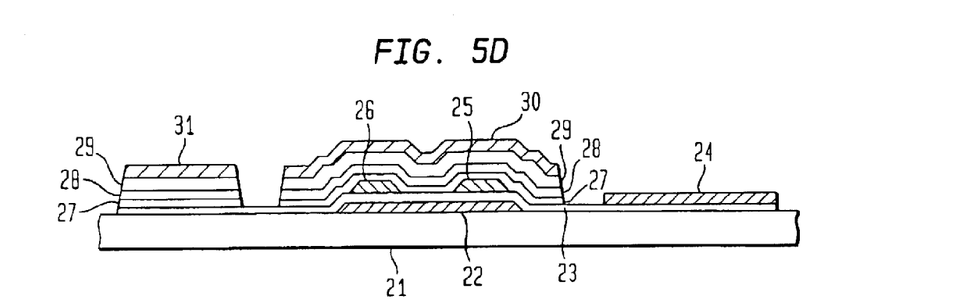

Then, as shown in FIG. 5(d), the gate electrode 30 and gate line 31 are formed through photolithography. In case of this embodiment, the a-Si film 27 first SiNx film 28, and second SiNx film 29 are simultaneously etched by using the gate electrode 30 and gate line 31 as masks. As a result, because these films can be continuously etched through one-time lithography step, it is possible to greatly shorten the manufacturing process. In this case, by shortening the process, a TFT array is completed while an unnecessary semiconductor layer remains not only in the a-Si island region around the gate electrode 30 necessary as a TFT but also on the lower layer of the gate line 31. However, because the drain electrode 26 is patterned so as to stride the root of the gate electrode 30 in the step shown in FIG. 5(b), it is possible to prevent a potential from weakening due to crosstalk from an adjacent data line.

As described above, according to the TFT structure and TFT manufacturing process by this embodiment, it is possible to obtain the above superior operation/working effect. Moreover, in case of this embodiment, it is possible to minimize the influence of misalignment as a secondary effect.

Figure 6A:
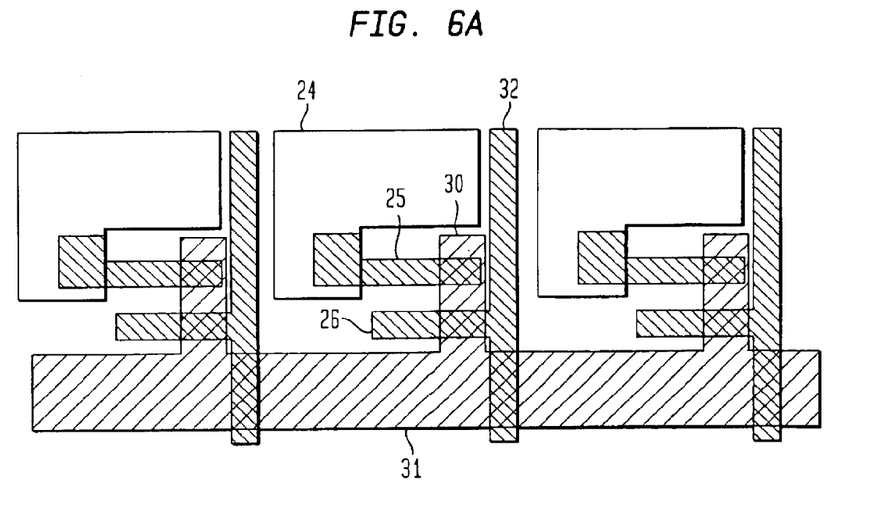
FIGS. 6(a) and 6(b) are top views showing a TFT structure when an alignment shift occurs.
Figure 6B:
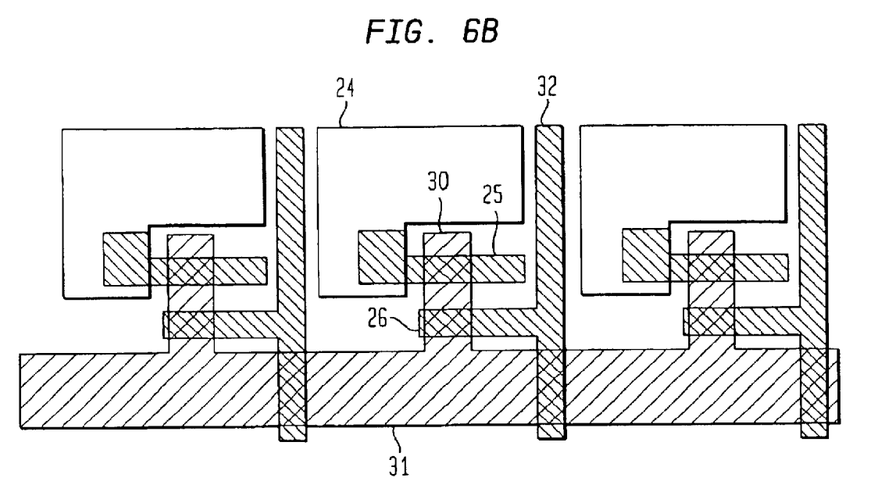

FIGS. 6(a) and 6(b) are top views showing a TFT structure when the misalignment occurs, in which FIG. 6(a) shows a state in which the gate electrode 30 and gate line 31 are greatly shifted to right and FIG. 6(b) shows a state in which the gate electrode 30 and gate line 31 are greatly shifted to left. In case of a TFT configured through the printing/plating art, thermal compression, chemical compression, and misalignment occur for patterning. Therefore, as shown in FIGS. 6(a) and 6(b), a shift occurs between the gate line 31 and the data line 32. The shift causes change of capacities (Cgs) between a gate and a source and thereby, causes flickering or sticking. Moreover, when the source electrode 25 or drain electrode 26 is removed from the gate electrode 30, the yield is greatly lowered because no electric charge is written in the pixel electrode 24 and thereby, a panel is not driven at all. Because this embodiment is configured so that the source electrode 25 and the drain electrode 26 are almost parallel with each other and almost orthogonal to a protruded portion on which the gate electrode 30 is formed, the value of Cgs is not changed at all even if alignment errors shown in FIGS. 6(a) and 6(b) occur. Therefore, it is possible to prevent a display portion from deteriorating. Furthermore, even if an alignment error occurs, it is possible to prevent crosstalk from coming from an adjacent data line by the drain electrode 26 and obtain a stable display image.

As described above, the present invention makes it possible to reduce the number of necessary steps in a thin-film-transistor manufacturing process and effectively prevent an abnormal potential from being generated due to a leak current from other data line.

While the invention has been particularly shown and described with respect to preferred embodiments thereof, it will be understood by those skilled in the art that the foregoing and other changes in form and details may be made therein without departing form the spirit and scope of the invention.

Having thus described our invention, what we claim as new, and desire to secure by Letters Patent is:

1. A thin film transistor comprising:
   a gate electrode disposed on a substrate and formed in a predetermined pattern;
   a gate line disposed on said substrate and formed in a predetermined pattern, and connected to the gate electrode to conduct gate signals to the gate electrode;
   a semiconductor layer formed correspondingly to patterning of said gate electrode and patterning of said gate line;
   a pixel electrode interposed by said semiconductor layer; and
   a signal electrode interposed by said semiconductor layer and disposed at a predetermined interval from said pixel electrode,
   wherein said signal electrode is positioned between said gate line and said pixel electrode to prevent crosstalk current flowing from an adjacent signal electrode, via said semiconductor layer, to said pixel electrode.

2. The thin film transistor according to claim 1, wherein said semiconductor layer is formed in a substantially equivalent pattern to said patterning of said gate electrode and of said gate line.

3. The thin film transistor according to claim 1, wherein:
   said gate electrode and said gate line are provided on said substrate; and
   said semiconductor layer and a gate insulating film are formed below said gate electrode and said gate line and pattern-formed correspondingly to said patterning of said gate electrode and of said gate line.

4. The thin film transistor according to claim 1, wherein said semiconductor layer is formed as a layer beneath a gate insulating film which is formed beneath said gate electrode and said gate line.

5. The thin film transistor according to claim 1, wherein said gate electrode has a first dimension extending along said predetermined interval between said pixel electrode and said signal electrode and a second dimension extending transverse to said first dimension, and said signal electrode extends entirely across said second dimension of said gate electrode to prevent crosstalk current flowing from an adjacent signal electrode, via said semiconductor layer, to said pixel electrode.

6. The thin film transistor according to claim 5, wherein said first dimension is a length of said gate electrode, and said second dimension is a width of said gate electrode.

7. The thin film transistor according to claim 5, wherein said signal electrode extends entirely across, and extends further beyond each side of, said second dimension of said gate electrode to prevent crosstalk current flowing from an adjacent signal electrode, via said semiconductor layer, to said pixel electrode.

* * * * *